United States Patent
Cadouri (10) Patent No.: US 7,913,206 B1
(45) Date of Patent: Mar. 22, 2011

(54) METHOD AND MECHANISM FOR PERFORMING PARTITIONING OF DRC OPERATIONS

(75) Inventor: Eitan Cadouri, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 11/228,472

(22) Filed: Sep. 15, 2005

Related U.S. Application Data (60) Provisional application No. 60/611,003, filed on Sep. 16, 2004.

(51) Int. Cl.
    *G06F 17/50* (2006.01)
(52) U.S. Cl. .......................... 716/106; 716/112
(58) Field of Classification Search .............. 716/4–5, 716/106, 112; 718/107, 100; 709/201, 226
    See application file for complete search history.

(56) References Cited

U.S. PATENT DOCUMENTS

| | | | |
|---|---|---|---|
| 5,299,139 A | 3/1994 | Baisuck et al. | |
| 5,339,415 A * | 8/1994 | Strout et al. | 718/102 |
| 5,440,720 A | 8/1995 | Baisuck et al. | |
| 5,537,329 A | 7/1996 | Feldmann et al. | |
| 5,559,718 A | 9/1996 | Baisuck et al. | |
| 5,581,475 A | 12/1996 | Majors | |
| 5,613,102 A | 3/1997 | Chiang et al. | |
| 5,812,415 A | 9/1998 | Baisuck | |
| 5,828,880 A * | 10/1998 | Hanko | 718/106 |
| 5,870,313 A | 2/1999 | Boyle et al. | |
| 6,003,066 A * | 12/1999 | Ryan et al. | 709/201 |
| 6,009,250 A | 12/1999 | Ho et al. | |
| 6,035,107 A | 3/2000 | Kuehlmann et al. | |
| 6,047,116 A | 4/2000 | Murakami et al. | |
| 6,066,179 A | 5/2000 | Allan | |
| 6,185,583 B1 * | 2/2001 | Blando | 715/210 |
| 6,237,128 B1 | 5/2001 | Folberth et al. | |
| 6,289,369 B1 * | 9/2001 | Sundaresan | 718/103 |
| 6,324,673 B1 | 11/2001 | Luo et al. | |
| 6,389,451 B1 * | 5/2002 | Hart | 709/201 |
| 6,401,240 B1 * | 6/2002 | Summers | 717/130 |
| 6,505,327 B2 * | 1/2003 | Lin | 716/5 |
| 6,519,749 B1 * | 2/2003 | Chao et al. | 716/9 |
| 6,536,028 B1 | 3/2003 | Katsioulas et al. | |
| 6,560,766 B2 * | 5/2003 | Pierrat et al. | 716/19 |
| 6,574,788 B1 | 6/2003 | Levine et al. | |
| 6,629,293 B2 * | 9/2003 | Chang et al. | 716/4 |

(Continued)

OTHER PUBLICATIONS

"Mentor Consulting Helps AMD Win Another Race to Market", 2001, Mentor Graphics Corporation, www.mentor.com, 4 pages.*

(Continued)

*Primary Examiner* — Vuthe Siek
*Assistant Examiner* — Patrick Sandoval
(74) *Attorney, Agent, or Firm* — Vista IP Law Group LLP (57) ABSTRACT

An improved method and mechanism for data partitioning for a DRC tool is disclosed that efficiently and effectively allows parallelization and multithreading to occur for DRC analysis of the IC design. Data partitioning is performed to allow some of the data to be processed in parallel by distributed processing units, while allowing other of the data to be processed in parallel by multiple threads. This can be accomplished by identifying different types of rules and data, and having different types of processing for the different types of rules and data. Certain types of rules/data will be processed with multi-threaded processing and other types of rules/data will be processed in parallel using distributed processing units.

30 Claims, 4 Drawing Sheets

U.S. PATENT DOCUMENTS

| | | | |
|---|---|---|---|
| 6,701,504 B2* | 3/2004 | Chang et al. | 716/10 |
| 6,721,928 B2* | 4/2004 | Pierrat et al. | 716/4 |
| 6,738,954 B1 | 5/2004 | Allen et al. | |
| 6,829,757 B1 | 12/2004 | Teig et al. | |
| 6,996,790 B2* | 2/2006 | Chang | 716/4 |
| 7,047,506 B2 | 5/2006 | Neves et al. | |
| 7,051,307 B2 | 5/2006 | Ditlow et al. | |
| 7,089,511 B2 | 8/2006 | Allen et al. | |
| 7,107,559 B2 | 9/2006 | Lakshmanan et al. | |
| 7,155,698 B1 | 12/2006 | Gennari | |
| 7,177,859 B2* | 2/2007 | Pather et al. | 707/3 |
| 7,266,795 B2* | 9/2007 | Baumgartner et al. | 716/5 |
| 7,318,214 B1 | 1/2008 | Prasad et al. | |
| 7,340,742 B2* | 3/2008 | Tabuchi | 718/103 |
| 7,401,208 B2* | 7/2008 | Kalla et al. | 712/224 |
| 7,421,505 B2* | 9/2008 | Berg | 709/230 |
| 7,500,240 B2* | 3/2009 | Shoemaker et al. | 718/102 |
| 7,526,740 B2* | 4/2009 | Bohl et al. | 716/4 |
| 2001/0003843 A1 | 6/2001 | Scepanovic et al. | |
| 2002/0049956 A1 | 4/2002 | Bozkus et al. | |
| 2002/0162085 A1* | 10/2002 | Zolotykh et al. | 716/18 |
| 2003/0012147 A1* | 1/2003 | Buckman et al. | 370/260 |
| 2003/0014471 A1* | 1/2003 | Ohsawa et al. | 709/107 |
| 2003/0014473 A1* | 1/2003 | Ohsawa et al. | 709/107 |
| 2003/0018684 A1* | 1/2003 | Ohsawa et al. | 709/102 |
| 2003/0023939 A1* | 1/2003 | Pierrat et al. | 716/3 |
| 2003/0033509 A1* | 2/2003 | Leibholz et al. | 712/228 |
| 2003/0037117 A1* | 2/2003 | Tabuchi | 709/207 |
| 2004/0006584 A1* | 1/2004 | Vandeweerd | 709/107 |
| 2004/0015256 A1 | 1/2004 | Conrad et al. | |
| 2004/0019679 A1* | 1/2004 | E et al. | 709/226 |
| 2004/0019892 A1* | 1/2004 | E. et al. | 718/107 |
| 2004/0044979 A1 | 3/2004 | Aji et al. | |
| 2004/0098511 A1* | 5/2004 | Lin et al. | 709/249 |
| 2004/0187112 A1* | 9/2004 | Potter, Jr. | 718/100 |
| 2004/0199887 A1 | 10/2004 | Jain et al. | |
| 2004/0215932 A1* | 10/2004 | Burky et al. | 712/43 |
| 2004/0215939 A1* | 10/2004 | Armstrong et al. | 712/220 |
| 2004/0216101 A1* | 10/2004 | Burky et al. | 718/100 |
| 2004/0268354 A1* | 12/2004 | Kanai et al. | 718/100 |
| 2005/0038852 A1* | 2/2005 | Howard | 709/205 |
| 2005/0091634 A1 | 4/2005 | Gallatin et al. | |
| 2005/0097561 A1* | 5/2005 | Schumacher et al. | 718/106 |
| 2005/0102681 A1* | 5/2005 | Richardson | 719/321 |
| 2005/0132320 A1 | 6/2005 | Allen et al. | |
| 2005/0138474 A1 | 6/2005 | Jain et al. | |
| 2005/0166173 A1 | 7/2005 | Cote et al. | |
| 2005/0216870 A1 | 9/2005 | DeCamp et al. | |
| 2005/0216875 A1 | 9/2005 | Zhang et al. | |
| 2005/0262510 A1* | 11/2005 | Parameswaran et al. | 718/105 |
| 2006/0005154 A1 | 1/2006 | Cobb et al. | |
| 2006/0062430 A1* | 3/2006 | Vallone et al. | 382/103 |
| 2006/0123420 A1* | 6/2006 | Nishikawa | 718/104 |
| 2006/0200825 A1* | 9/2006 | Potter, Jr. | 718/100 |
| 2006/0230370 A1 | 10/2006 | Baumgartner et al. | |
| 2006/0253813 A1 | 11/2006 | Rittman | |
| 2006/0265675 A1 | 11/2006 | Wang | |
| 2007/0079268 A1 | 4/2007 | Jones et al. | |
| 2007/0192545 A1* | 8/2007 | Gara et al. | 711/141 |
| 2007/0220232 A1* | 9/2007 | Rhoades et al. | 712/20 |
| 2007/0233805 A1* | 10/2007 | Grodd et al. | 709/208 |
| 2007/0271562 A1* | 11/2007 | Schumacher et al. | 718/100 |
| 2009/0125867 A1 | 5/2009 | Cote et al. | |

OTHER PUBLICATIONS

"Mentor Graphics Unveils Calibre MTflex to Combat Cost of Nanometer Design Compute Requirements", May 12, 2003, Mentor Graphics Corporation, www.mentor.com, 2 pages.*

Ferguson, "Calibre Mtflex: Reducing the High Cost of Processing Power", Mar. 2004, Mentor Graphics Corporation, pp. 1-5, www.mentor.com.*

Bender, M.A. et al. "On-the-Fly Maintenance of Series-Parallel Relationships in Fork-Join Multithreaded Programs" Proceedings of the 16th Annual ACM Symposium on Parallelism in Algorithms and Architectures, Barcelona, Spain, 2004, pp. 133-144.

Kalas, I. et al. "FTL: A Multithreaded Environment for Parallel Computation" Proceedings of the 1994 Conference of the Centre for Advanced Studies on Collaborative Research, Toronto, Ontario, Canada, 1994, pp. 1-12.

Krishnaswamy, V. et al. "Actor Based Parallel VHDL Simulation Using Time Warp" Proceedings of the 10th Workshop on Parallel and Distributed Simulation, 1996, pp. 135-142.

Lee, P.M. et al. "A Parallel and Accelerated Circuit Simulator with Precise Accuracy" Proceedings of the 15th International Conference on VLSI Design (VLSI '02), Bangalore, India, Jan. 7-11, 2002, pp. 1-6.

Magarshack, P. et al. "System-on-Chip Beyond the Nanometer Wall" Proceedings of the 40th Conference on Design Automation (DAC '03), Anaheim, CA, Jun. 2-6, 2003, pp. 419-424.

Prabhu, A.M. "Management Issues in EDA" Proceedings of the 31st Conference on Design Automation (DAC '94), San Diego, CA, Jun. 6-10, 1994, pp. 41-47.

Saavedra-Barrera, R.H. et al. "Analysis of Multithreaded Architectures for Parallel Computing" Proceedings of the Second Annual ACM Symposium on Parallel Algorithms and Architectures (SPAA '90), Island of Crete, Greece, 1990, pp. 169-178.

Spiller, M.D. et al. "EDA and the Network" Proceedings of the 1997 IEEE/ACM International Conference on Computer-Aided Design (CAD '97), San Jose, CA, 1997, pp. 470-476.

Cadence Design Systems, Inc. "Assura Layout vs. Schematic Verifier" 2003, 4 pgs., Cadence Design Systems, Inc., San Jose, CA.

Mentor Graphics Corporation "Calibre LVS: Precise IC Layout Verification with the Schematic Design", 2005, 4 pgs., Mentor Graphics Corporation, San Jose, CA.

Schellenberg, F. "Mask EDA Workshop" Copyright 1999-2001, 47 pgs., Mentor Graphics Corporation, San Jose, CA.

Office Action dated Sep. 28, 2007 for U.S. Appl. No. 11/225,816.
Office Action dated Mar. 9, 2007 for U.S. Appl. No. 11/225,853.
Office Action dated Sep. 7, 2007 for U.S. Appl. No. 11/225,853.
Office Action dated Sep. 17, 2007 for U.S. Appl. No. 11/225,815.
Office Action dated Apr. 4, 2008 for U.S. Appl. No. 11/520,487.
Office Action dated Jun. 11, 2008 for U.S. Appl. No. 11/225,853.
Office Action dated Apr. 8, 2008 for U.S. Appl. No. 11/225,816.
Notice of Allowance dated Mar. 11, 2008 for U.S. Appl. No. 11/225,815.

Fliesler, M. "Mentor Consulting Helps AMD WIN Another Race to Market", 2001, pp. 1-5, Mentor Graphics Corporation, San Jose, CA.

Scherber et al., PALACE: A parallel and hierarchical layout analyzer and cirucite extractor, Mar. 1996, European Design and Test Conference.

Notice of Allowance dated May 29, 2009 for U.S. Appl. No. 11/520,487.

Non-Final Office Action dated Feb. 4, 2010 for U.S. Appl. No. 11/225,816.

Notice of Allowance dated Sep. 18, 2009 for U.S. Appl. No. 11/520,487.

Yoo, S-M. et al. "Largest-Job-First-Scan-All Scheduling Policy for 2D mesh-Connected Systems", IEEE, 1996.

Final Office Action dated Dec. 7, 2009, for U.S. Appl. No. 11/225,853.

Final Office Action date Jan. 21, 2010 for U.S. Appl. No. 11/479,600.
Final Office Action dated Jan. 2, 2009 for U.S. Appl. No. 11/225,853.
Final Office Action dated Jan. 8, 2009 for U.S. Appl. No. 11/520,487.
Office Action dated Dec. 18, 2008 for U.S. Appl. No. 11/225,816.

Teo, Y.M. et al. "A compensation-based scheduling scheme for Grid Computing" Proceeding of the 7th International Conference on High Performance Computing and Grid, pp. 334-342, IEEE Computer Society Press, Tokyo, Japan, Jul. 20-22, 2004.

Banicescu, I. et al. "Overhead Analysis of a Dynamic Load Balancing Library for Cluster Computing" Proceedings of the 19th IEEE International Parallel and Distributed Processing Symposium (IPDPS'05), 2005.

Cadence Design Systems, Inc. "Diva Reference" Product Version 4.4.6, Jun. 2000, Cadence Design Systems, Inc. San Jose CA., part 1 of 14, pp. 1-49.

Cadence Design Systems, Inc. "Diva Reference" Product Version 4.4.6, Jun. 2000, Cadence Design Systems, Inc. San Jose CA., part 2 of 14, pp. 50-99.

Cadence Design Systems, Inc. "Diva Reference" Product Version 4.4.6, Jun. 2000, Cadence Design Systems, Inc. San Jose CA., part 3 of 14, pp. 100-149.
Cadence Design Systems, Inc. "Diva Reference" Product Version 4.4.6, Jun. 2000, Cadence Design Systems, Inc. San Jose CA., part 4 of 14, pp. 150-199.
Cadence Design Systems, Inc. "Diva Reference" Product Version 4.4.6, Jun. 2000, Cadence Design Systems, Inc. San Jose CA., part 5 of 14, pp. 200-249.
Cadence Design Systems, Inc. "Diva Reference" Product Version 4.4.6, Jun. 2000, Cadence Design Systems, Inc. San Jose CA., part 6 of 14, pp. 250-299.
Cadence Design Systems, Inc. "Diva Reference" Product Version 4.4.6, Jun. 2000, Cadence Design Systems, Inc. San Jose CA., part 8 of 14, pp. 350-399.
Cadence Design Systems, Inc. "Diva Reference" Product Version 4.4.6, Jun. 2000, Cadence Design Systems, Inc. San Jose CA., part 9 of 14, pp. 400-449.
Cadence Design Systems, Inc. "Diva Reference" Product Version 4.4.6, Jun. 2000, Cadence Design Systems, Inc. San Jose CA., part 10 of 14, pp. 450-499.
Cadence Design Systems, Inc. "Diva Reference" Product Version 4.4.6, Jun. 2000, Cadence Design Systems, Inc. San Jose CA., part 11 of 14, pp. 500-549.
Cadence Design Systems, Inc. "Diva Reference" Product Version 4.4.6, Jun. 2000, Cadence Design Systems, Inc. San Jose CA., part 12 of 14, pp. 550-599.
Cadence Design Systems, Inc. "Diva Reference" Product Version 4.4.6, Jun. 2000, Cadence Design Systems, Inc. San Jose CA., part 13 of 14, pp. 600-629.
Cadence Design Systems, Inc. "Diva Reference" Product Version 4.4.6, Jun. 2000, Cadence Design Systems, Inc. San Jose CA., part 14 of 14, pp. 630-658.
Dongarra, J.J. et al. "LAPACK Working Note 37 Two Dimensional Basic Linear Algebra Communication Subprograms" Technical Report University of Tennessee, 1991.
Mohapatra, P. et al. "A Lazy Scheduling Scheme for Hypercube Computers" Journal of Parallel and Distributed Computing 27, 26-27 (1995).
Niewczas, M. et al. "A Pattern Matching Algorithm for Verification and Analysis of Very Large IC Layouts" ISPD 98, Apr. 6-8, 1998, pp. 129-134.
Ousterhout J.K. "Corner Stitching: A Data-Structure Technique fro VLSI Layout Tools" IEEE Transactions on Computer Aided-Design of Integrated Circuits and Systems, vol. CAD-3, No. 1, pp. 97-100, Jan. 1984.
Teo, Y.M. et al. "A compensation-based scheduling scheme for Grid Computing" Proceeding of the 7th International Conference on High Performance Computing and Grid, pp. 334-342, IEEE Computer Society Press, Tokyo, Japan, Jul. 20-22, 2004.
Office Action dated Feb. 18, 2009 for U.S. Appl. No. 11/228,472.
Office Action dated Jan. 2, 2009 for U.S. Appl. No. 11/225,853.
Office Action dated Jan. 8, 2009 for U.S. Appl. No. 11/520,487.
Non-Final Office Action dated Nov. 24, 2010 for U.S. Appl. No. 11/479, 600.
Final Office Action dated Feb. 2, 2001 for U.S. Appl. No. 11/225,816.

* cited by examiner

METHOD AND MECHANISM FOR PERFORMING PARTITIONING OF DRC OPERATIONS

CROSS-REFERENCE TO RELATED APPLICATIONS

The present application claims the benefit of U.S. Provisional Application No. 60/611,003, filed on Sep. 16, 2004, which is hereby incorporated by reference in its entirety.

BACKGROUND

The invention relates to technology for implementing electronic design automation tools, and in particular, design tools for performing parallel and multithreaded design rule checks (DRC) for an integrated circuit ("IC") design.

An IC is a small electronic device typically formed from semiconductor material. Each IC contains a large number of electronic components, e.g., transistors, that are wired together to create a self-contained circuit device. The components and wiring on the IC are materialized as a set of geometric shapes that are placed and routed on the chip material. During placement, the location and positioning of each geometric shape corresponding to an IC component are identified on the IC layers. During routing, a set of routes are identified to tie together the geometric shapes for the electronic components.

A set of design rules are established to ensure that the objects/shapes on the IC design can be properly manufactured. These rules are usually established by the foundry that will produce the IC chip. A DRC tool is used to check for violations of the rules on the IC design.

Given the large numbers of components in a typical IC design and the large number of rules that must be checked, it often takes a long period of time and a significant amount of system resources (both for CPU and memory) to perform a DRC check on a given IC design. This provides the motivation for EDA tool vendors to provide a method for parallelizing the DRC operations that must be performed against an IC design.

Solutions have been proposed to partition data for DRC operations to allow parallelization of the DRC process. There have been several suggested approaches for data partitioning. A first approach is partitioning based upon the rules and a second approach is based on hierarchy. Conventionally, these are mutually exclusive approaches, and while there is some efficiency in each one of them, these are also problems with each approach.

When data partitioning is performed based on rules, one of the most significant problems is that network jamming may occur. This is because the entire design file (e.g., a GDSII file) is sent to each distributed computer that is processing in parallel based upon the rules. This means that there is a lot of traffic being placed on the network.

The other approach is to partition the design using a hierarchy where the system sends different blocks affecting the design from one distributed processing unit to another. The problem with data partitioning using this approach is that when the system is trying to verify the top level, problems dealing with the connectivity between the blocks may exist. Conventional systems cannot efficiently or optimally manage this type of problem.

There may also exist other proposed approaches, such as windowing. However, these other approaches are also mutually exclusive approaches, and while there is some efficiency in each one of them, there are also problems with each approach.

Therefore, it is highly desirable to implement an improved method and mechanism for data partitioning for a DRC tool that will efficiently and effectively allow parallelization and multithreading to occur for DRC analysis of the IC design. Some embodiments of the invention provide an improved method and mechanism for data partitioning for a DRC tool that allows parallelization and multithreading to occur for DRC analysis of the IC design. Data partitioning is performed in some embodiments to allow some of the data to be processed in parallel by distributed processing units, while allowing other of the data to be processed in parallel by multiple threads. This can be accomplished by identifying different types of rules and data, and having different types of processing for the different types of rules and data. Certain types of rules/data will be processed with multi-threaded processing and other types of rules/data will be processed in parallel using distributed processing units.

DETAILED DESCRIPTION

An embodiment of the present invention provides an approach for data partitioning that provides more efficient parallel physical verification (PV) processing of an IC design in an electronic design automation (EDA) tool. DRC is an example of one type of PV, processing that may be performed upon an IC design. In one embodiment, data partitioning occurs to allow some of the data to be processed in parallel by distributed processing units, while allowing other of the data to be processed in parallel by multiple threads.

In one embodiment, this is accomplished by identifying different types of rules and data, and having different types of processing for the different types of rules and data. Certain types of rules/data will be processed with multi-threaded processing and other types of rules/data will be processed in parallel using distributed processing units.

Figure 1:
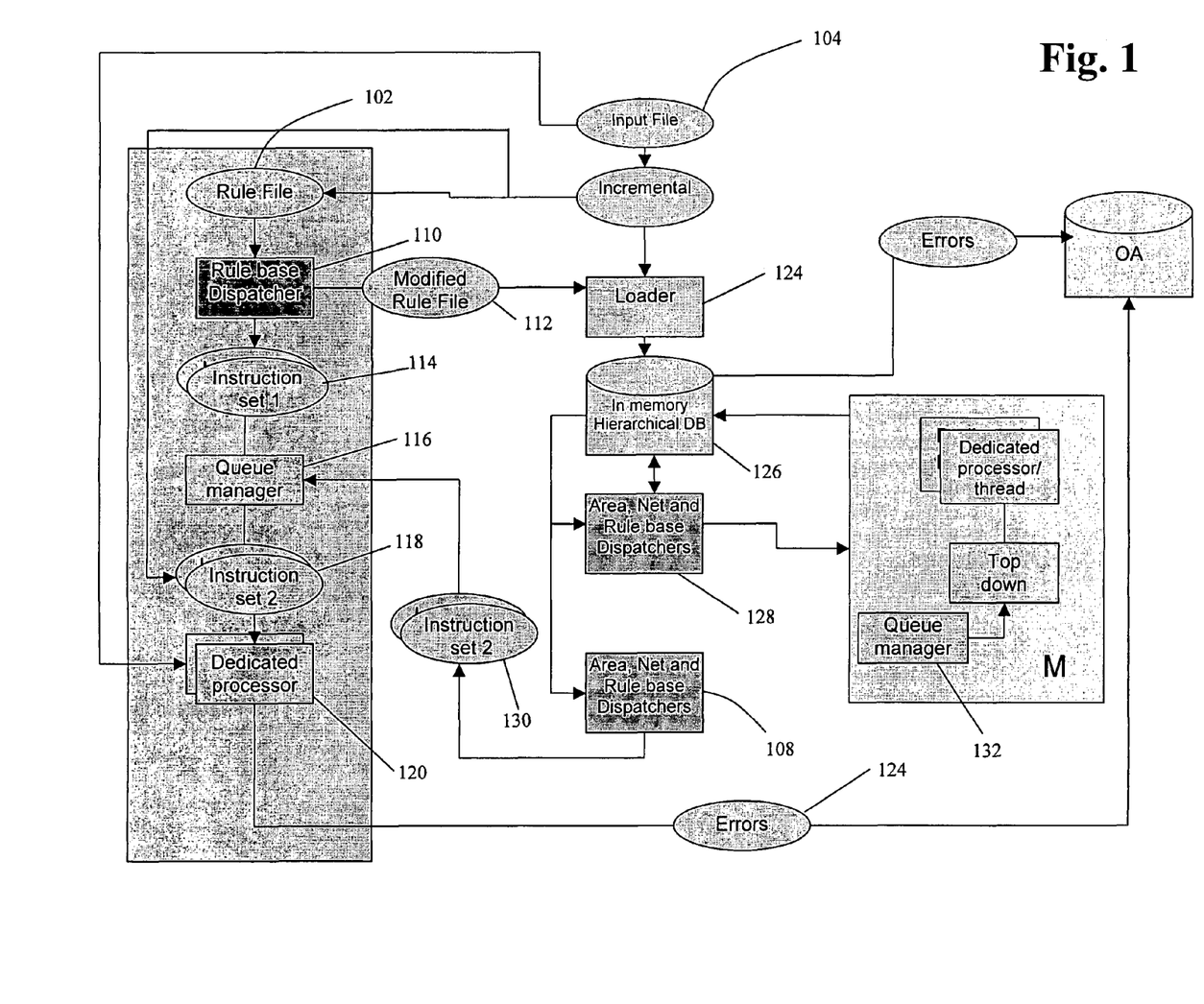
FIG. 1 illustrates a system for performing DRC operations using data partitioning in accordance with some embodiments of the invention.

FIG. 1 shows a diagram of an architecture for data partitioning according to an embodiment of the invention. In this diagram, there are three different type of shapes. The oval shapes in FIG. 1 represent data. The rectangular shapes reflect operations. The conical shapes represent a database or data storage element.

On the left side of the diagram, shown is an input file for the verification system, which is a rule file 102. The rule file 102 contains the design rules to be checked during the DRC process. Another input file is shown in the center of the diagram, which is the input design file 104, e.g., in GDSII format, which needs to be verified. An example of a common database type that can be employed to store and access data, such as the GDSII data, is based upon the Open Access™ standard. Open Access (OA) is a standard for IC designs that allows foundational interoperability for design data between different types of PV tools. More information regarding Open Access can obtained from the Silicon Integration Initiative, Inc. (Si2), an organization that promulgates standards for the EDA industry (www.si2.org).

A partition action on the left side of the diagram step is performed by a rule based dispatcher 110. The rules based dispatcher 110 modifies the rule desk into two sections. One of them is a modified rule file 112 that will be used for the multi-threading operations, and the second one is further modification that is not used to partition the data, but to create instructions 114 of how to further partition the data. So at this point, there has not yet been any distribution of GDSII data. Instead, only instructions on how to partition the data have been generated. Essentially, the system will determine how to partition the data, and sending instructions to the queue manager over the network will not have any significant impact on the run time or network usage at this point.

In the next action, the queue manager 116 will manage and obtain a list of jobs to process; here, the queue manager will manage the generation of the instruction set 2 118. Instructions are sent to each of the dedicated processing units 120. In addition, the GDSII files are sent to each of the respective processing units. Processing will occur at the different distributed processing units in parallel based upon the rules to check corresponding to the instruction set.

Based upon this processing, any detected errors will be collected in an error file. The error files will be transferred to the report storage mechanism on the right-hand side of the diagram.

In one embodiment, the report storage mechanism will communicate immediately with the users about the errors 124 that are identified, without waiting for processing of the entire design to be completed. If so, then once the first error (or first grouping of errors) is detected, the user will have access to those reports and does not have to wait until the entire job is completed. Thus, the user will be able to start fixing problems immediately as they were found. This provides a significant advantage over prior approaches that provides errors only after all or a substantial portion of the processing has been completed. For example, consider a DRC processing job that would normally take 20 hours to complete. In the present embodiment, if the first error is detected at 1 hour into the processing, rather than waiting the entire 20 hours before producing an error for the user, the user is immediately granted access to information about the detected error. This provides a much improved response time over prior art solutions.

Therefore, the partitioning of the data that is on the left side of these diagram describe the parallel processing activities. It has a reduced load over conventional parallel processing approaches since reduces the load that is placed on the network. In addition, the queue manager can adjust the load that is placed on the network and the dedicated processors to optimally allocate work in the system and to minimize excessive load on the network and other system components.

Now an explanation will be provided of the flow that is at the center of the diagram. What happens here is that the rule file was partitioned into instruction sets, and in the middle of the diagram, the modified rule file is sent to the loader 124. The loader loads relevant part(s) of the GDSII file into an in-memory database 126. So, one thing being done is a top-down hierarchical step is processed, e.g., the geometries that overlaps one of the cells.

Once this has completed, the block-based dispatcher will perform its operations. The dispatcher can operated based upon area, net, and/or rule based controls 128. At this phase of the operation, the data is partitioned into blocks, and based upon the given instruction set, the further partitioning can be handled by different dedicated threads/processors. The dedicated threads/processors will perform processing on its assigned blocks and will modify the in-memory database.

In one embodiment, the flow that appears at the center of the diagram is a multithreaded flow. With multithreaded processing in one embodiment, the multiple threads share the same memory. If the parallel threads share the common data in memory, the performance of the system is significantly improved, since the GDSII data is loaded only once for this operation.

Once results on the block are completed, an error file can be generated that is stored in the report storage mechanism. As before, it is noted that this accelerates the access that is granted to users of information about detected errors in the IC design.

There is another level of the rules-based dispatcher 108 that is implemented in this architecture. It may occur that jobs originating with the multi-threaded portion of the system actually should be processed in the parallel/distributed portion of the system. The rules-based dispatcher 108 will essentially fork a process in the distributed environment and send an instruction set 130 to the queue manager on the left side of the diagram. These jobs generated in the middle portion of the diagram can therefore be processed in a parallel distributed environment controlled by the queue manager.

Thus, the system has different dispatchers that work in the different stages of the verification process. A first advantages provided by this system are that it reduces the loading of the network, since a portion of the parallel processing is performed in a multi-threaded environment in which the memory is shared. In addition, this system significantly accelerates the time to error much faster than existing approaches. Moreover, this system allows integrated processing using both multithreading and distributed computing, providing the advantages of both approaches.

The system integrates control between the queue manager(s) and the dispatcher(s) to allocate work in the system. The dispatchers is configured with intelligence about the data to be processed. The dispatcher determines which part of the processing is performed with multithreading and which portion is performed in a distributed manner. In one embodiment, there are three different criteria. One of them is hierarchy based, the second one is rule-based, and the third one is a windowing base. The dispatcher is configured to identify what kind of rules/data should be executed at each portion of the system.

An approach for implementing a system having both windowing and rules-based criteria is disclosed in co-pending U.S. application Ser. No. 11/225,816, entitled "Method and System for Implementing Compilation and Execution of DRC Rules", filed on Sep. 12, 2005, Atty. Docket No. CA7044922001, which is hereby incorporated by reference in its entirety. Further information about an exemplary approach for implementing rules-based parallelism is described in co-pending U.S. application Ser. No. 11/225,815, entitled "Method and System for Parallelizing Computing Operations", Atty. Docket No. CA7045492001, filed on Sep. 12, 2005, which is hereby incorporated by reference in its entirety. Further information about an exemplary approach for implementing parallelism using windows is described in co-pending U.S. application Ser. No. 11/225,853, entitled "Method and System for Implementing Parallel Processing of Electronic Design Automation Tools", Atty. Docket No. CA7045322001, filed on Sep. 12, 2005, which is hereby incorporated by reference in its entirety.

The queue manager(s) 116, 132 acts as the resource manager for the system. It knows from a machine point of view where to start directing work traffic in the system. The queue manager 116 on the left side of the diagram monitors and allocates work among the different processing units that are distributed in the system. The queue manager 132 in the middle of the diagram monitors and allocates work among the threads in the system. System information may be made available to the queue manager(s) to allow optimal allocation of work among the available resources in the system.

Figure 2:
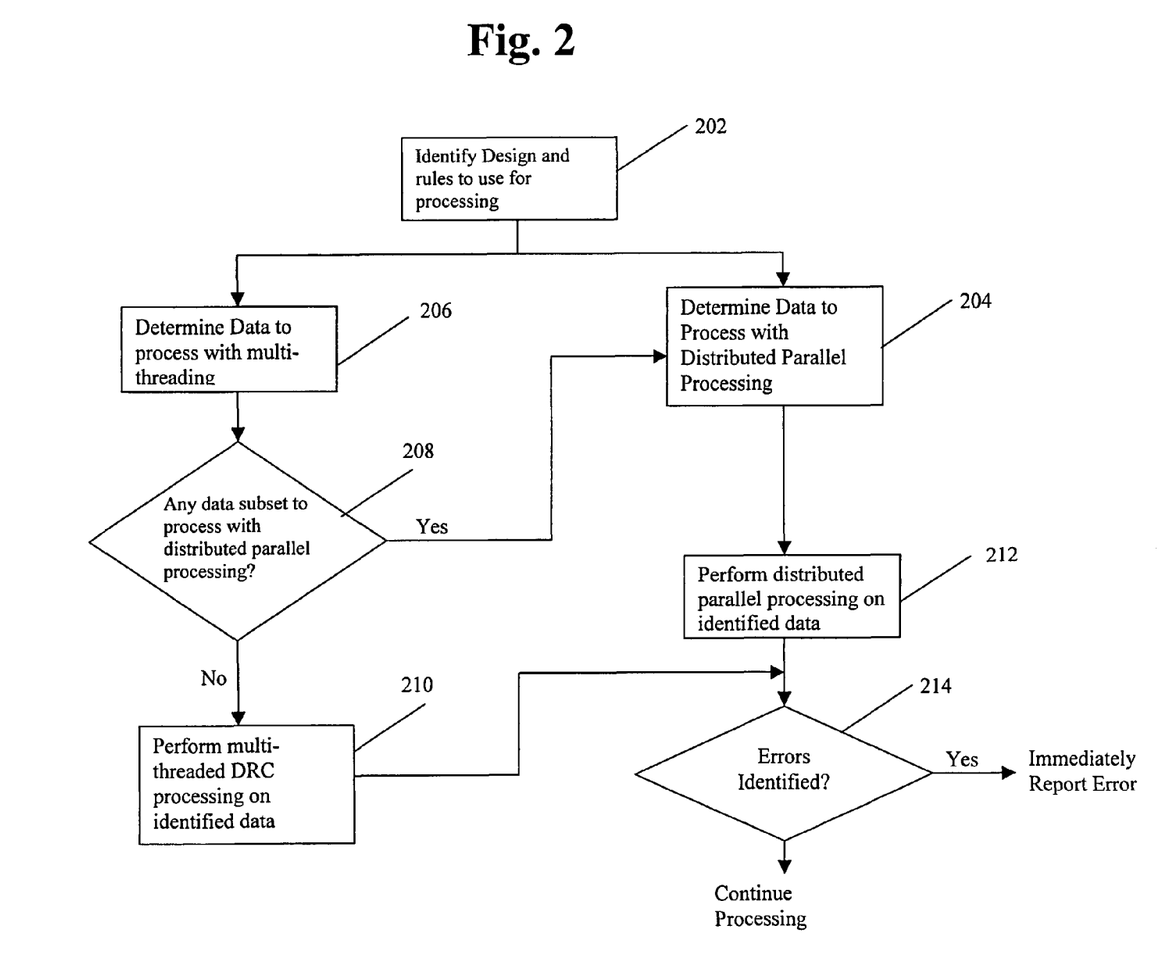
FIG. 2 shows a flow of a process for performing DRC operations using data partitioning in accordance with some embodiments of the invention.

FIG. 2 shows a flowchart of a process for data partitioning according to an embodiment of the invention. The process begins by identifying the design data and rules to use for the DRC processing (202). For example, the design data may be a given GDSII file and the rules may be a rule deck that is supplied by the foundry that will be manufacturing an IC product based upon the design file.

A determination is made regarding which portion of the data should be processed using distributed processing (204). A determination is also made regarding which portion of the data should be processed using multi-threaded processing (206). It is noted that in this embodiment, it may be determined that a subset of data that has been associated with multi-threaded processing may be redirected to be processed using distributed computing (208). While not shown in the flowchart, in an alternate embodiment, a subset of data that has been associated with distributed processing may be redirected to be processed using multi-threaded computing. The identified data is processed with multi-threading at 210. Identified data is processed with parallel processing at 212.

During processing, the process will communicate immediately with the users about the errors that are identified, without waiting for processing of the entire design to be completed 214. Once errors are detected, the user will have access to those reports and does not have to wait until the entire job is completed. Thus, the user will be able to start fixing problems immediately as they were found. If no errors are found, then processing is continued.

Figure 3:
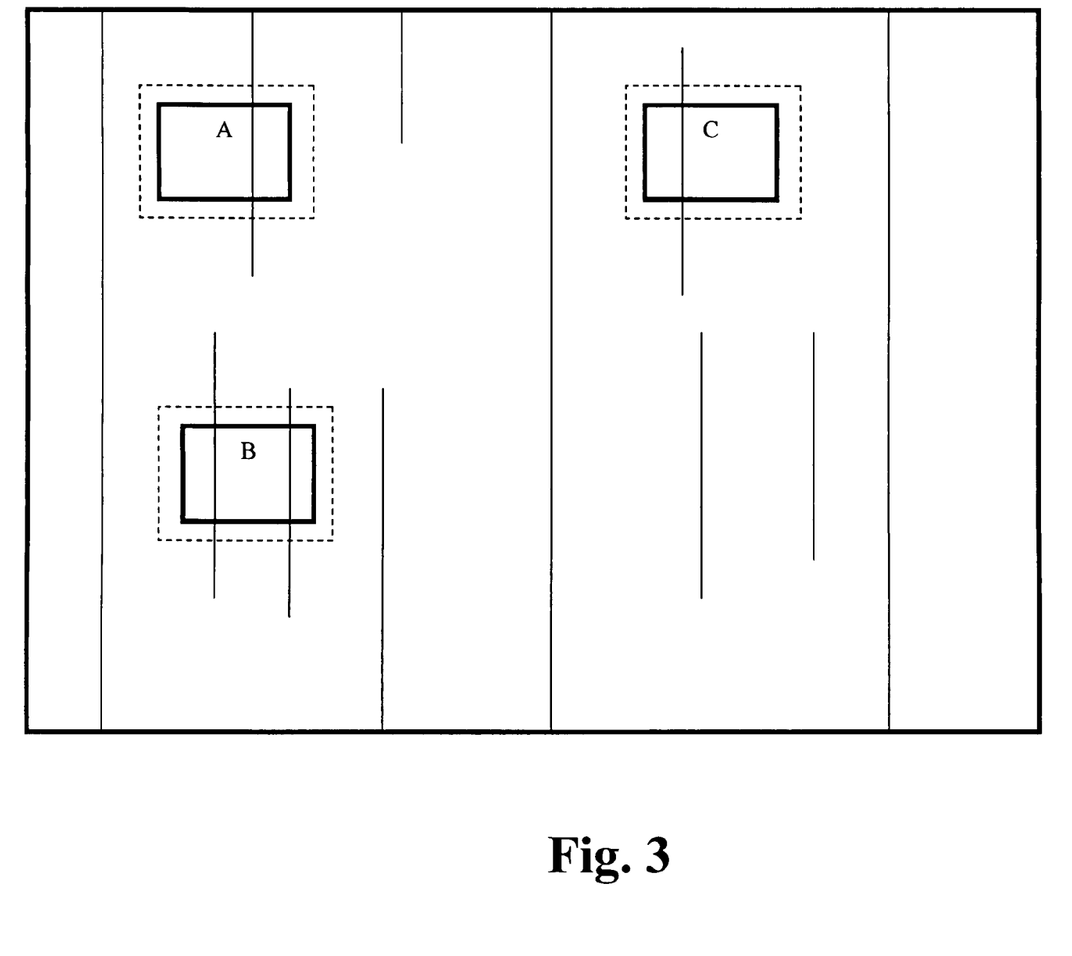
FIG. 3 provides an illustrated example of design portion to be analyzed.

To provide an illustrated embodiment, reference will now be directed to FIG. 3. Assume that FIG. 3 shows a portion of an IC design having blocks A, B, and C. Numerous metal lines are shown overlaid on this portion of the IC design.

In one embodiment, the rule based dispatcher will be configured to handle metals differently from other design elements and to create instructions that state that all metal is to be checked in the flat mode. Spacing rules, e.g., width-dependent spacing rules, will also be checked in flat mode in this embodiment. Metal to via checks in one embodiment can be checked by a windowing application. The rule-based dispatcher will generate the instruction sets for the different engines and will submit the job into the queue manager. The queue manager will modify the instruction sets and submit jobs to different machines. If it is assumed that the system has many dedicated processors, then at this stage, the above checks will be performed in parallel at the distributed processors.

Modified rule files will be generated for multi-threaded processing that exclude the checks that are being performed in a flat mode, and therefore those checks will not be submitted into the main flow and sent to the loader. The loader will get the modified rules set, and based on the modified rules, will load the appropriate portions of the GDSII data into an in-memory database. The top-down hierarchical data for the IC design will be loaded. In this example, this means that the metal overlap on top of blocks A, B &C will be calculated and this includes the polygon elements that overlap blocks A, B, and C. Referring to FIG. 3, shown are dotted rectangles that are drawn around blocks A, B, and C. Information about the block area surrounding blocks A, B, and C will be calculated and stored in-memory database.

Once this process is completed, then the top-down hierarchical analysis is completed and at that point the block-based dispatcher can work to help distribute work. In the present example, the dispatcher takes block A and its surrounding, takes block B and its surrounding, and takes block C and its surrounding and creates an instruction set that is used by the queue manager to assign jobs to the different threads in the multi-threaded system. So at this point, since there are multiple threads operating upon blocks A, B, and C in parallel, this processing should complete in an efficient manner.

It may be determined that a portion of this data should also be processed in a distributed manner. For example, the dispatcher may determine that block C should be processed in a distributed parallel manner, e.g., because it is determined that some of the rules should be processed flat rather than hierarchically. If this is the case, then an instruction set is created and sent to the queue manager for the distributed processing. The queue manager will assign job(s) to the dedicated processors in the distributed system to handle processing of the rules for block C.

The system will modify the in-memory database based upon the processing. The identified errors are generated and made available to the user immediately, and therefore this allows results to reach the top level very quickly.

System Architecture Overview

Figure 4:
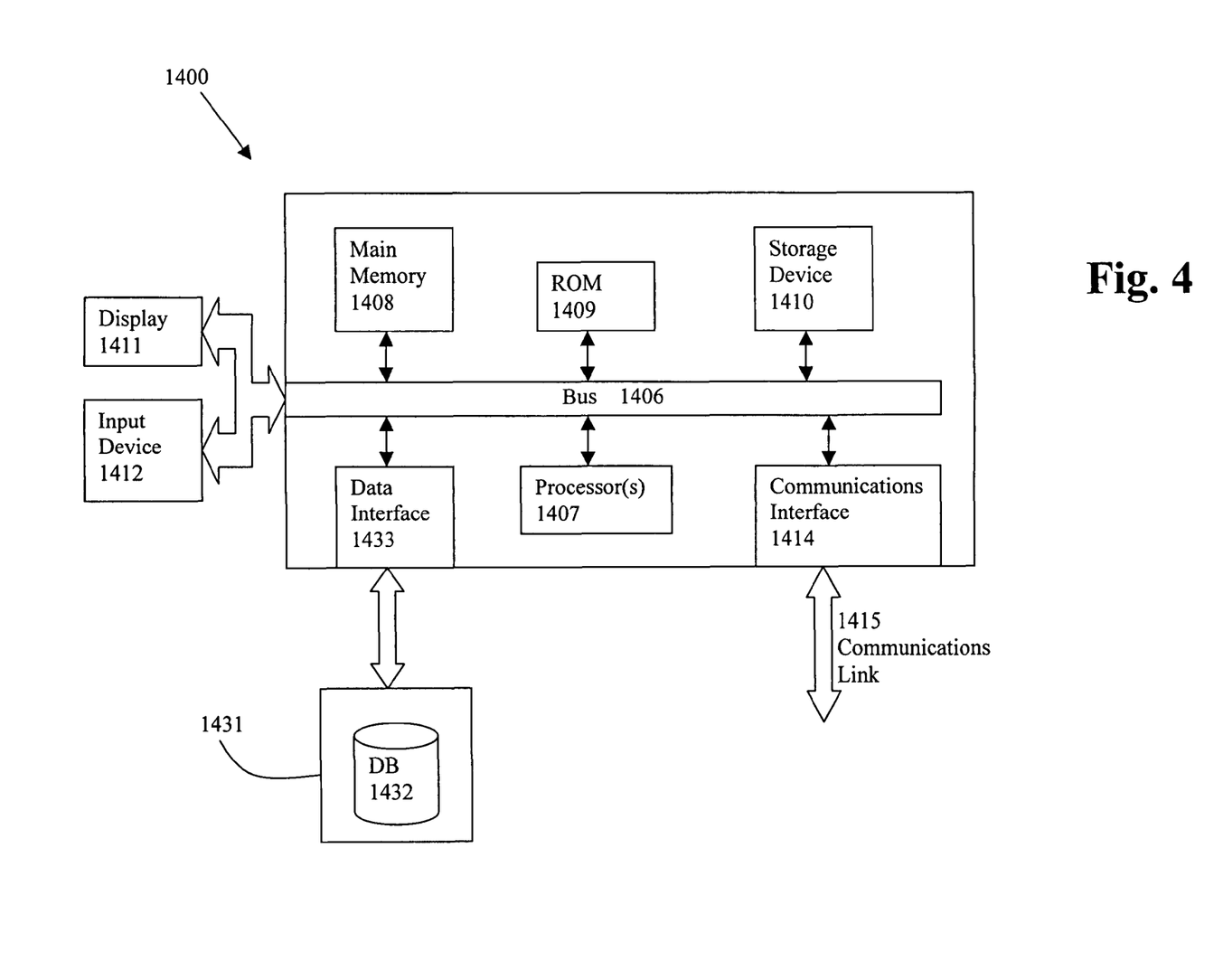
FIG. 4 illustrates an example computing architecture with which embodiments of the invention may be practiced.

FIG. 4 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media, volatile media, and transmission media. Non-volatile media includes, for example, optical or magnetic disks, such as disk drive 1410. Volatile media includes dynamic memory, such as system memory 1408. Transmission media includes coaxial cables, copper wire, and fiber optics, including wires that comprise bus 1406. Transmission media can also take the form of acoustic or light waves, such as those generated during radio wave and infrared data communications.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be, evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A system for performing physical verification processing on an integrated circuit (IC) design, comprising:
   a parallel portion for distributed processing of the IC design, the parallel portion comprising a parallel queue manager to manage a first set of instructions for partitioning an IC design data of the IC design into a first IC design data, the first set of instructions based at least in part upon one or more design rules corresponding to the IC design;
   a multi-threaded portion for multi-threaded processing of the IC design, in which the multi-threaded portion comprises a multi-threaded queue manager which manages a second set of instructions associated with the IC design data partitioned for multi-threaded processing, wherein a subset of the second set of instructions for a subset of a second IC design data of the IC design originating with the multi-threaded portion is sent to the parallel queue manager of the parallel portion to be processed in parallel by a plurality of processing units;
   the plurality of processing units to process physical verification operations in parallel, the first set of instructions and the subset of the second set of instructions being processed by the plurality of processing units;
   a plurality of threads for performing multi-threaded processing of the IC design, the second set of instructions being processed by the plurality of threads, wherein the first IC design data and the subset of the second IC design data of the IC design are processed with the distributed processing, and the second IC design data of the IC design minus its subset is processed with the multi-thread processing; and
   a dispatcher for managing a job associated with the second IC design data, wherein the job originates in the multi-threaded portion and is redirected to be processed in the parallel portion such that the subset of the second IC design data is of the type to be processed with the multi-threaded processing but has been redirected to be processed by using the distributed processing.

2. The system of claim 1 in which the set of one or more design rules is partitioned into the instruction sets.

3. The system of claim 1 further comprising a loader, the loader performing the function of loading relevant parts of the IC design into memory.

4. The system of claim 1 further comprising one or more dispatchers configured with knowledge about data to be processed with either multi-threading or parallel processing.

5. The system of claim 4 in which the one or more dispatchers operate based upon area, net, or rule based controls to dispatch work to a processing entity.

6. The system of claim 1 in which the job originating with a second system portion for multi-threading is managed by the dispatcher for processing by a first system portion.

7. The system of claim 1 in which the job originating with a first system portion is managed by the dispatcher for processing by a second system portion.

8. The system of claim 1 in which physical verification errors are reported without waiting for the entire IC design to be processed.

9. The system of claim 1 wherein the queue managers perform resource management for the system by directing work to particular processing entities.

10. The system of claim 1 for performing physical verification processing, in which the first system portion may invoke the second queue manager to process part or all of the first set of instructions.

11. A system for performing data partitioning for design rule checks (DRC) processing of an integrated circuit (IC) design, comprising:
    a parallel portion for distributed processing of a first set of data of the IC design, in which the parallel portion manages a first set of instructions and processes based at least in part upon a first set of rules;
    a multi-threaded portion for multi-threaded processing of a second set of data of the IC design, in which the multi-threaded portion manages a second set of instructions and processes using a second set of rules, wherein the multi-threaded portion passes the second set of instructions originating with the multi-threaded portion to the parallel portion for processing in parallel by a plurality of processing units if the second set of data should also be processed in parallel based at least upon the first set of rules so that the first set of data and the second set of data of the IC design is processed with the distributed processing; and
    a dispatcher for managing a job associated with the second set of data of the IC design, wherein the job originates in the multi-threaded portion and is redirected to be processed in the parallel portion such that the second set of data of the IC design is of the type to be processed with the multi-threaded processing but has been redirected to be processed by using distributed processing.

12. The system of claim 11 in which one or more queue managers are used to distribute work to resources in the system.

13. The system of claim 11 in which one or more dispatchers are used to distribute work between the parallel portion and the multi-threaded portion.

14. The system of claim 11 in which error information are made available before the entire IC design has been completely processed.

15. The system of claim 11 in which an in-memory hierarchical database is used to store data for processing by the multi-threaded portion.

16. The system of claim 11 in which top-down processing is performed to identify data to process with the multi-threaded portion.

17. The system of claim 11 in which data is sent from the multi-threaded portion to be processed by the parallel portion.

18. The system of claim 11 for performing data partitioning for DRC processing of an IC design, in which the first system portion may pass data to the second system portion for processing.

19. A computer-implemented method for performing data partitioning for design rule check (DRC) processing of an integrated circuit (IC) design, comprising:
identifying the IC design for processing and rules to apply for the DRC processing;
determining a first set of IC design data to process with distributed processing;
determining a second set of IC design data to process with multi-threaded processing;
identifying a first subset of IC design data originating with the first set of IC design data that should be processed with multi-threaded processing;
identifying a second subset of ID design data originating with the second set of IC design data that should be processed with distributed processing;
adjusting the first and second set of IC design data, wherein the first subset of IC design data is sent to the second set of IC design data and the second subset of IC design data is sent to the first set of data;
performing distributed processing upon the first set of IC design data comprising the second subset of data;
performing, by using one or more processors, multi-threaded processing upon the second set of IC design data comprising the first subset of IC design data;
managing a job associated with the second set of IC design data by using a dispatcher, wherein the job originates with the second set of IC design data and is redirected to be processed by distributed processing such that the second subset of IC design data originating with the second set of data is of a type to be processed with the multi-threaded processing but has been redirected to be processed by using the distributed processing; and
storing the processed data in a non-transitory computer readable medium or displaying the processed data on a display device.

20. The method of claim 19 further comprising the act of reporting error information before the entire IC design has been completely processed.

21. The method of claim 19 in which the IC design is partitioned based upon area, net, or rule based controls.

22. The method of claim 19 in which a first group of rules and data are identified as being processed in the first set and a second group of rules and data are identified as being processed in the second set.

23. A computer program product comprising a tangible computer usable medium having executable code to execute a process by a processor for performing data partitioning for design rule check (DRC) processing of an integrated circuit (IC) design, the process comprising:
identifying the IC design for processing and rules to apply for the DRC processing;
determining a first set of IC design data to process with distributed processing;
determining a second set of IC design data to process with multi-threaded processing;
identifying a first subset of IC design data originating with the first set of IC design data that should be processed with multi-threaded processing;
identifying a second subset of IC design data originating with the second set of IC design data that should be processed with distributed processing;
adjusting the first and second set of IC design data, wherein the first subset of IC design data is sent to the second set of IC design data and the second subset of IC design data is sent to the first set of IC design data;
performing distributed processing upon the first set of IC design data comprising the second subset of data;
performing multi-threaded processing upon the second set of IC design data comprising the first subset of IC design data;
managing a job associated with the second set of IC design data by using a dispatcher, wherein the job originates with the second set of IC design data and is redirected to be processed by distributed processing such that the second subset of IC design data originating with the second set of data is of a type to be processed with the multi-threaded processing but has been redirected to be processed by using the distributed processing; and
storing the processed data or displaying the processed data on a display device.

24. The computer program product of claim 23 further comprising the act of reporting error information before the entire IC design has been completely processed.

25. The computer program product of claim 23 in which the IC design is partitioned based upon area, net, or rule based controls.

26. The computer program product of claim 23 in which a first group of rules and data are identified as being processed in the first set and a second group of rules and data are identified as being processed in the second set.

27. A machine-implemented method for performing physical verification processing on an integrated circuit (IC) design, comprising:
determining a first set of instructions which is managed by a parallel queue manager of a parallel portion for distributed processing, in which the first set of instructions is based at least in part upon one or more design rules corresponding to the IC design;
determining a second set of instructions which is managed by a multi-threaded queue manager of a multi-threaded portion for multi-threaded processing;
determining whether part or all of the second set of instructions is to be processed in the parallel portion, the part or all of the second set of instructions originating with the multi-threaded portion;
adjusting the first and the second set of instructions based at least in part upon a result of the act of determining whether part or all of the second set of instructions is to be processed in the parallel portion, wherein the part or all of the second set of instructions is sent to the parallel queue manager for distributed processing;
processing by a processor the first set of instructions and the part or all of the second set of instructions by a plurality of parallel distributed processing units, wherein a first IC design data and a subset of a second IC design data of the IC design is processed with the distributed processing, and a the second IC design data of the IC design minus its subset is processed with the multi-threaded processing;
managing a job associated with the second IC design data, wherein the job originates in the multi-threaded portion and is redirected to be processed in the parallel portion such that the subset of the second IC design data is of the type to be processed with the multi-threaded processing but has been redirected to be processed by using the distributed processing; and storing a result of the processing on a non-transitory computer readable medium or displaying the result on a display device.

28. The machine-implemented method of claim 27, further comprising:

determining whether part or all of the first set of instructions is to be processed by the second system portion.

29. A computer program product comprising a tangible computer usable medium having executable code to execute a process for performing data partitioning for design rule check (DRC) processing of an integrated circuit (IC) design, the process comprising:

determining a first set of instructions which is managed by a parallel queue manager of a parallel portion for distributed processing, in which the first set of instructions is based at least in part upon one or more design rules corresponding to the IC design;

determining a second set of instructions which is managed by a multi-threaded queue manager of a multi-threaded portion for multi-threaded processing;

determining whether part or all of the second set of instructions is to be processed in the parallel portion, the part or all of the second set of instructions originating with the multi-threaded portion;

adjusting the first and the second set of instructions based at least in part upon a result of the act of determining whether part or all of the second set of instructions is to be processed in the parallel portion, wherein the part or all of the second set of instructions is sent to the parallel queue manager for distributed processing;

processing the first set of instructions and the part or all of the second set of instructions by a plurality of parallel distributed processing units, wherein a first IC design data and a subset of a second IC design data of the IC design is processed with the distributed processing, and the second IC design data of the IC design is minus its subset processed with the multi-thread processing;

managing a job associated with the second IC design data, wherein the job originates in the multi-threaded portion and is redirected to be processed in the parallel portion such that the subset of the second IC design data is of the type to be processed with the multi-threaded processing but has been redirected to be processed by using the distributed processing; and storing a result of the processing on a tangible computer readable medium or displaying the result on a display device.

30. The computer program product of claim 29, in which the process further comprises:

determining whether part or all of the first set of instructions is to be processed by the multi-threaded portion.

\* \* \* \* \*